United States Patent [19]

Griffith

[11] Patent Number: 5,182,547
[45] Date of Patent: Jan. 26, 1993

[54] NEUTRAL WIRE CURRENT MONITORING FOR THREE-PHASE FOUR-WIRE POWER DISTRIBUTION SYSTEM

[75] Inventor: David C. Griffith, Chagrin Falls, Ohio

[73] Assignee: High Voltage Maintenance, Dayton, Ohio

[21] Appl. No.: 641,679

[22] Filed: Jan. 16, 1991

[51] Int. Cl.$^5$ ............................................. G08B 21/00
[52] U.S. Cl. .................................... 340/664; 340/638; 324/133; 324/127
[58] Field of Search .............. 340/664, 644, 638, 659, 340/657; 324/133, 127; 361/93, 94; 335/17

[56] References Cited

U.S. PATENT DOCUMENTS

| | | |
|---|---|---|
| 2,736,884 | 2/1956 | Yemomans. |
| 3,771,049 | 11/1973 | Piccione. |
| 3,902,168 | 8/1975 | Dola. |
| 3,967,257 | 6/1976 | Hager. |
| 4,243,982 | 1/1981 | Yarbrough. |
| 4,263,589 | 4/1981 | Lewiner et al. ............... 340/638 |
| 4,593,276 | 6/1986 | Aida et al. ..................... 340/664 |
| 4,691,197 | 9/1987 | Damiano et al. .............. 340/638 |
| 4,714,916 | 12/1987 | Schweitzer, Jr. ............... 340/664 |
| 4,725,825 | 2/1988 | McKean ........................ 340/660 |
| 4,808,917 | 2/1989 | Fernandes et al. ............ 324/127 |
| 4,879,626 | 11/1989 | Kim .............................. 340/662 X |
| 5,015,944 | 5/1991 | Bubash ......................... 340/664 X |

OTHER PUBLICATIONS

Nonlinear Loads Mean Trouble-Arthur Freund-Mar. 1988 EC&M p. 83, p. 90.

Double the Neutral and Derate the Transformer-Or Else! Arthur Freund-Dec. 1988-EC&M p. 81-p. 85.

Primary Examiner—Jin F. Ng
Assistant Examiner—Jeffery A. Hofsass
Attorney, Agent, or Firm—Killworth, Gottman, Hagan & Schaeff

[57] ABSTRACT

A neutral circuit current monitoring device detects at least one current level, which includes harmonic currents, flowing in a neutral circuit of a power distribution system such that preliminary warnings can be given to personnel operating the system before serious overload problems exist. Warnings can be given via audible and/or visual alarms and/or by electrical contacts which can be used to operate auxiliary devices. Preferably, two current levels defined by interchangeable secondary fuses within the monitoring circuit are detected with a first or low current level in the neutral circuit being calculated to also indirectly monitor for overheating of the distribution transformer caused mainly by circulating third harmonic currents in the transformer primary. The low current level permits personnel to investigate and correct a developing problem before it occurs. Preferably, a second or high current level of the current sensor can be set at a value less than 100% of the phase current rating. The monitoring device may be set up such that when the high current level is exceeded the monitor once again activates an alarm and/or trips a protecting circuit breaker located at the input or output of a distribution transformer to protect the transformer as well as the neutral circuit.

20 Claims, 2 Drawing Sheets

NEUTRAL WIRE CURRENT MONITORING FOR THREE-PHASE FOUR-WIRE POWER DISTRIBUTION SYSTEM

BACKGROUND OF THE INVENTION

The present invention relates generally to electric power distribution systems and, more particularly, to an inexpensive and reliable method and apparatus for monitoring current in a neutral circuit for three-phase four-wire electric power distribution systems which detects harmonic currents flowing in the neutral circuit wherein harmonic currents would otherwise go undetected and cause damage to the power distribution system.

There is a danger of undetected and unprotected distribution circuit overloads in buildings due to the increasing use of office automation equipment such as personal computers, computer terminals, facsimile machines, and xerographic copiers. Such office automation equipment is powered by simply plugging the equipment into familiar power outlets within the building. These overloads are caused by harmonic currents generated by power supplies within the equipment. Unfortunately, a building manager normally has little knowledge or control of what equipment is plugged into the power distribution system and such equipment can vary greatly over time. A properly loaded power distribution system today can change to an overloaded system tomorrow without the manager's knowledge. Even with conventional approved wiring practices, power distribution equipment failure can result and worse still, a fire safety problem can be produced.

The problem arises in buildings with three-phase four-wire power distribution systems such as 208Y/120V system. In a typical building, the majority of the power is distributed via single phase 120 volt (120V) branch circuits which are connected to the power outlets. If a shared neutral conductor is used for a plurality of single phase branch circuits, a potential for a severe overload condition exists for that conductor.

The primary winding of the distribution transformer, if the transformer is delta/wye, is also subject to overload when powering the noted office automation equipment even though the secondary phases powering the single phase branch circuits are not overloaded. Overloading of the primary winding is due to circulating 3rd harmonics and multiples of the 3rd harmonics which occur when the primary winding of the distribution transformer is wired in a delta configuration, which is usually the case.

The harmonic currents which create the overload problems of the neutral conductors are generated by power supplies which use full wave bridge rectifiers tightly coupled to relatively large filter and energy storage shunt capacitors in the power supplies. The capacitors remain charged to near the peak of the applied ac voltage and accordingly draw recharging current only during the narrow periods of each half cycle of applied ac voltage when that voltage exceeds the capacitor voltage. These pulses of current are of the fundamental 60 hertz frequency (60 Hz) but are rich in 3rd harmonic components and usually also contain significant 5th and 7th harmonics. The harmonic content varies with circuit values such as the size of the capacitor. In a three-phase four-wire system, the 3rd harmonic current and its multiples from each phase add in the neutral conductor even with balanced loads whereas the fundamental and the other harmonic currents cancel in the neutral conductor. In the worst case when 100% of the rated current is flowing in each phase, 173% of the rated current is flowing in the neutral conductor when only this rectified form of load is connected.

The existence of this problem is well known in the computer industry and efforts to advise customers of it are underway through the Computer and Business Equipment Manufacturers Association (CBEMA). CBEMA recommends, among other things, installation of an over current detector in the neutral conductor which will trip an upstream circuit breaker to protect the neutral conductor from overheating if it is not feasible to oversize the neutral conductor. They also recommend a periodic inspection of the electrical system to detect overload and/or overtemperature.

This creates a dilemma for an office building manager who may never have an overload or unsafe condition. On the one hand, it is not attractive to upgrade a power distribution system, potentially at great expense, for a problem which may never occur. On the other hand, periodic testing which consistently shows a properly loaded power distribution system is likely to be discontinued as an unnecessary expense.

Even if testing is performed on a periodic basis, it may not detect a problem in time to prevent overheating with potential fire hazard and equipment damage. Further, an unscheduled shutdown of power, especially to the office automation equipment causing the problem, may well be disruptive and possibly expensive for the users even though protection, such as circuit tripping, is necessary for safety. In addition, office automation equipment can even be effected if no shut down occurs. Harmonic neutral circuit overloads can result in loosening of connections in the neutral circuit which, in combination with neutral currents, can produce common mode neutral to ground noise in the power system leading to data errors in the office automation equipment.

Thus, there is a need for an inexpensive and reliable neutral circuit monitoring device for three-phase four-wire electric power distribution systems which detects harmonic currents flowing in neutral circuits and warns operators of the power distribution systems of an overload condition before the occurrence of damage to the power distribution systems or problems in equipment powered by the systems.

SUMMARY OF THE INVENTION

This need is met by the neutral circuit current monitoring method and apparatus of the present invention which detect currents, including harmonic currents, flowing in a neutral circuit of a power distribution system. The neutral circuit current monitoring detects at least one current level such that preliminary warnings can be given to a building manager before serious overload problems exist.

Preferably, two current levels are detected with a first or low current level in a neutral conductor being calculated to also indirectly monitor for overheating of the distribution transformer caused mainly by circulating third harmonic currents in the transformer primary. The level of the low current alarm setting is based upon typical phase unbalance conditions and the size of the transformer relative to the rest of the distribution system. The low current alarm level permits a building manager to investigate and correct a developing problem before it occurs.

A second or high current level of the current sensor can be set at a value to account for the transformer rating and neutral conductor ampacity at the third harmonic. The high current level will usually be substantially less than 100% of the phase current rating. The monitoring circuit may be set up such that when the high current level is exceeded the monitor trips a protecting circuit breaker located at the input or output of the distribution transformer to protect the transformer as well as the neutral circuit. With the current monitoring of the present invention, the cost of periodic inspections for a potential problem, which may never occur, is drastically reduced and yet, ultimate protection of the distribution circuit against overload is assured even if the building manager fails to correct the problem in time. By combining monitoring with the protection function, normal safe operation is assured with a minimum of investment and no addition of power equipment.

In accordance with one aspect of the present invention, current monitoring apparatus for detecting at least one defined current level in a neutral circuit of a three-phase four-wire electric power distribution system comprises current transformer means coupled to the neutral circuit for generating a current signal representative of current flowing through the neutral circuit. Fuse means are connected in shunt across the current transformer means for conducting current signals up to a current rating of the fuse means. If the fuse means is operated in response to current signals exceeding the current rating of the fuse means, alarm means connected in shunt across the fuse means are powered from the transformer means for alerting personnel operating the power distribution system.

In the preferred embodiment of the invention, dc conversion means are connected between the fuse means and the alarm means for converting the current signal received from the current transformer means to a dc signal for driving the alarm means if the fuse means is operated. The dc conversion means may comprise a diode bridge circuit or preferably a voltage doubler circuit. To ensure that there are no false alarms and to prevent altering the characteristics of the fuse means, the current monitoring circuit may further comprise isolation means for isolating the alarm means from the dc conversion means until the fuse means is operated. The isolation means preferably comprises an SCR connected to conduct current through the alarm means and to be triggered by a defined voltage level across the dc conversion means, the defined voltage level is reached only upon operation of the fuse means.

The current transformer means may comprise a split transformer where it is desired to couple the transformer to the neutral circuit without disturbing the neutral circuit. The current transformer means may be coupled to the neutral circuit by two or more loops of wire within the neutral circuit to make the apparatus less sensitive to in-rush currents. The alarm means may comprise an audible alarm and/or a visual alarm. It may be desirable to provide one alarm form for a first detected current level and another or a combined alarm form for a second, higher detected current level. In the currently preferred embodiment of the present invention, the fuse means comprises at least two fuses each having different current ratings whereby the level of the current signal which activates the alarm means can be determined by selection of one of the at least two fuses. The fuse means may also comprise one or more positive temperature coefficient resistance devices with abrupt resistance change at their operating or trip points.

In accordance with another aspect of the present invention, a method of monitoring current in a neutral circuit of a three-phase four-wire electric power distribution system for detecting at least one defined current level therein comprises the steps of: coupling a current transformer to the neutral circuit; connecting a first fuse across the current transformer to shunt current signals generated by the transformer up to a first current rating defined by the first fuse; and, connecting alarm means across the first fuse, the alarm means being activated to generate an alarm signal upon operation of the fuse by current signals exceeding the rating of the first fuse.

The method may further comprise the step of connecting a second fuse across the current transformer to shunt current signals generated up to a second current rating greater than the first current rating if the first fuse is operated. In any event, the alarm means may comprise an audible alarm and/or a visible alarm. Preferably, the method further comprises the step of converting the current signals received from the current transformer to a dc signal for driving the alarm means if the first fuse is operated. To help ensure that there are no false alarms, the method may further comprise the step of isolating the alarm means from the dc signal.

It is thus an object of the present invention to provide an inexpensive and reliable method and apparatus for neutral circuit current monitoring to detect currents, including harmonic currents, flowing in a neutral circuit of a power distribution system; to provide an inexpensive and reliable neutral circuit current monitoring apparatus for detecting currents, including harmonic currents, flowing in a neutral circuit of a power distribution system which apparatus is self-powered from the currents being monitored; and, to provide an inexpensive and reliable neutral wire current monitoring circuit for detecting currents, including harmonic currents, flowing in a neutral circuit of a power distribution system wherein different current levels can be detected with the current levels being defined by associated fuse means.

BRIEF DESCRIPTION OF THE INVENTION

FIG. 1 is a schematic diagram of two simplified alternate embodiments of a neutral wire current monitoring circuit operable in accordance with the present invention; and FIG. 2 is a schematic diagram of a preferred embodiment a neutral wire current monitoring circuit operable to monitor multiple neutral wires in accordance with the present invention.

DETAILED DESCRIPTION OF THE PRESENT INVENTION

The invention of the present application addresses a problem which arises when a large number of switching mode power supplies (SMPS's) or the like are used in buildings with three-phase four-wire power distribution systems. SMPS's draw power from a line in the form of current pulses which are extremely nonlinear and high in harmonics. In single phase circuits with neutral conductors shared with other phases which distribute power to personal computers and other office equipment commonly using SMPS's, these harmonics are not canceled in the neutral circuit but add to overload the neutral circuit if a sufficient number of SMPS's are connected to the distribution circuits. In addition, circulating third harmonics in a delta primary winding of a power transformer can lead to failure of the transformer even though none of the individual circuits are overloaded.

A solution to this problem is to monitor the currents in the neutral wire on the secondary side of a power transformer in a manner which detects all currents including harmonic currents, to measure the total heating effect. This requires monitoring the true RMS current regardless of harmonic content. Unfortunately, monitoring arrangements suggest active circuitry which are typically complex and can require their own power supplies for proper operation. In accordance with the present invention such active circuitry and/or power supply is not needed leading to a method and apparatus for the inexpensive and reliable monitoring of neutral circuits.

Figure 1:
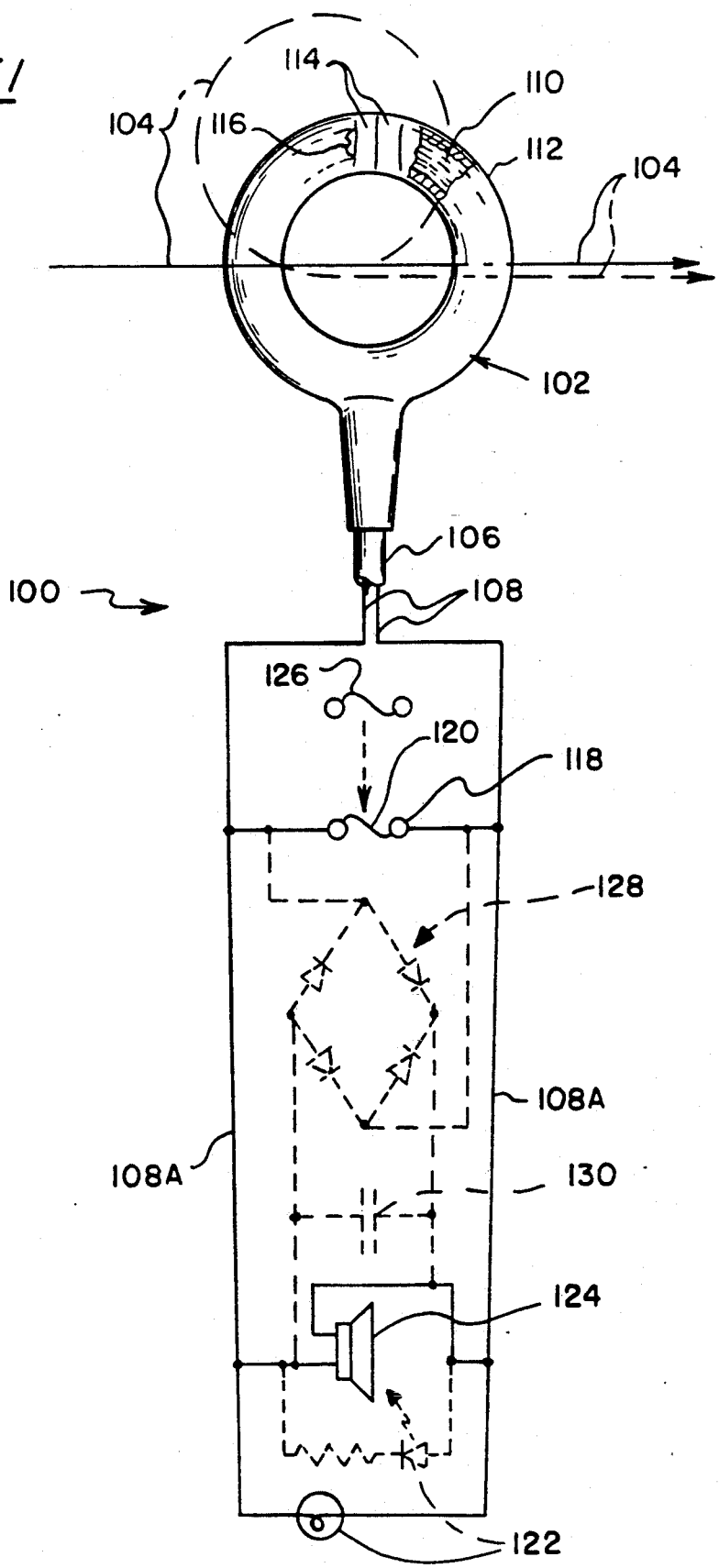

Reference will now be made to the drawings and in particular to FIG. 1 which illustrates in schematic diagram form two simplified embodiments of apparatus for performing the methods of the present invention. The monitoring circuit 100 of FIG. 1 comprises a toroidal transformer 102 which is coupled to a neutral wire 104 of a single phase power distribution circuit of a three-phase four-wire power distribution system. The transformer 102 includes a cable 106 enclosing a pair of electrical conductors 108 which are connected to the winding 110 encased within an insulating material 112.

For the illustrated embodiment, the transformer 102 is shown as a split core transformer which can be connected to the neutral wire 104 without disturbing the wire. Two ends of the core of the transformer 102 adjacent projecting ears 114 are spread apart for coupling the transformer 102 to the neutral wire 104. Once coupled to the neutral wire 104, the transformer 102 is returned to the position shown and secured in that position by a screw fastener 116. Of course, other forms of split core, removable section or wound core transformers can be used in the present invention.

It also should be apparent that solid core transformers including ones taking shapes other than a toroid can be used in the present invention. Such solid core transformers are best suited for use on relatively small neutral wires. For installation of solid core transformers without interrupting power, a portion of the insulation of a neutral wire is removed and the exposed portion of the wire is temporarily electrically connected to a neutral bus bar associated with the power distribution system. The neutral wire is then removed from the bus bar and inserted through the solid core transformer and reconnected to the bus bar. The temporary connection of the neutral wire to the neutral bus bar is then removed and insulation replaced to complete the installation.

As shown in FIG. 1, in some applications it may be preferred to loop the neutral wire 104 to make two or more passes through the transformer 102, whether solid core or not, to make the monitoring circuit 100 less sensitive to in-rush currents which could cause temporary false triggering of the alarm. Sensitivity is decreased by reducing the voltage drop across the fuse. For example, the allowable fuse rating to be used is doubled by doubling the number of neutral conductor turns. The doubling of the fuse rating reduces the resistance of the fuse by a factor of four (4) since dual element delay fuses of the same type have essentially a constant watt rating for operation. Thus, the result is double the current through one quarter of the previous resistance for one half the previous voltage drop.

The electrical conductors 108 are connected to a fuse holder 118 which includes a fuse element 120. The fuse element 120 has a current rating which is selected such that the fuse element will be operated or blown by defined current levels in the neutral wire 104. Once the fuse element 120 is blown, the power from the transformer 102 will activate an alarm. In FIG. 1, a visual alarm 122, which may comprise a low power light bulb for ac power or a light emitting diode (LED) for dc power, and an audible alarm 124 which may comprise a sounder or other suitable device. In accordance with the present invention, it is desirable to be able to alert personnel operating the power distribution system including the neutral wire 104 as early as possible that an overload condition is developing. To that end, the fuse element 120 corresponds to a first low current level such that it will be blown early in the build up of harmonic overload problems but with inverse current time delay to avoid fuse operation in the event of normal current surges generated for example, by motor start up or the like. Early notification permits the personnel, such as a building manager to take steps to correct the developing harmonic problems before the problems have grown to the point that damage can be done to the power distribution system including the neutral wire 104.

After the early notification provided by operation of the fuse element 120, a second fuse element 126 having a higher current rating can be inserted into the fuse holder 118 to replace the blown fuse element 120. This will deactivate the alarm and reset the monitoring operation. The fuse element 126 can be used to operate a visual alarm and/or an audible alarm the same as the fuse element 120 as shown in FIG. 1. Alternately, further action can be taken such as operating a circuit breaker(s) feeding the main circuit or appropriate branch circuit or feeding the power transformer of the power distribution system. Such operation of a neutral wire monitoring circuit will be more fully described hereinafter with reference to FIG. 2.

An alternate embodiment of neutral monitoring apparatus in accordance with the present invention is illustrated in dashed lines in FIG. 1. In the alternate dashed line embodiment of FIG. 1, the portions 108A of the conductors 108 are removed and replaced by a diode bridge circuit 128 and a capacitor 130 which convert the ac power delivered by the transformer 102 into filtered dc power. The filtered dc power provides for operation of the visual alarm 122, which can now comprise an LED as shown in dotted lines in FIG. 1, and the sounder device 124 at lowered power level than with ac power. The dc power arrangement also filters transient current surges, permits the use of different transformers and can operate common alarms when multiple circuits are used.

Figure 2:
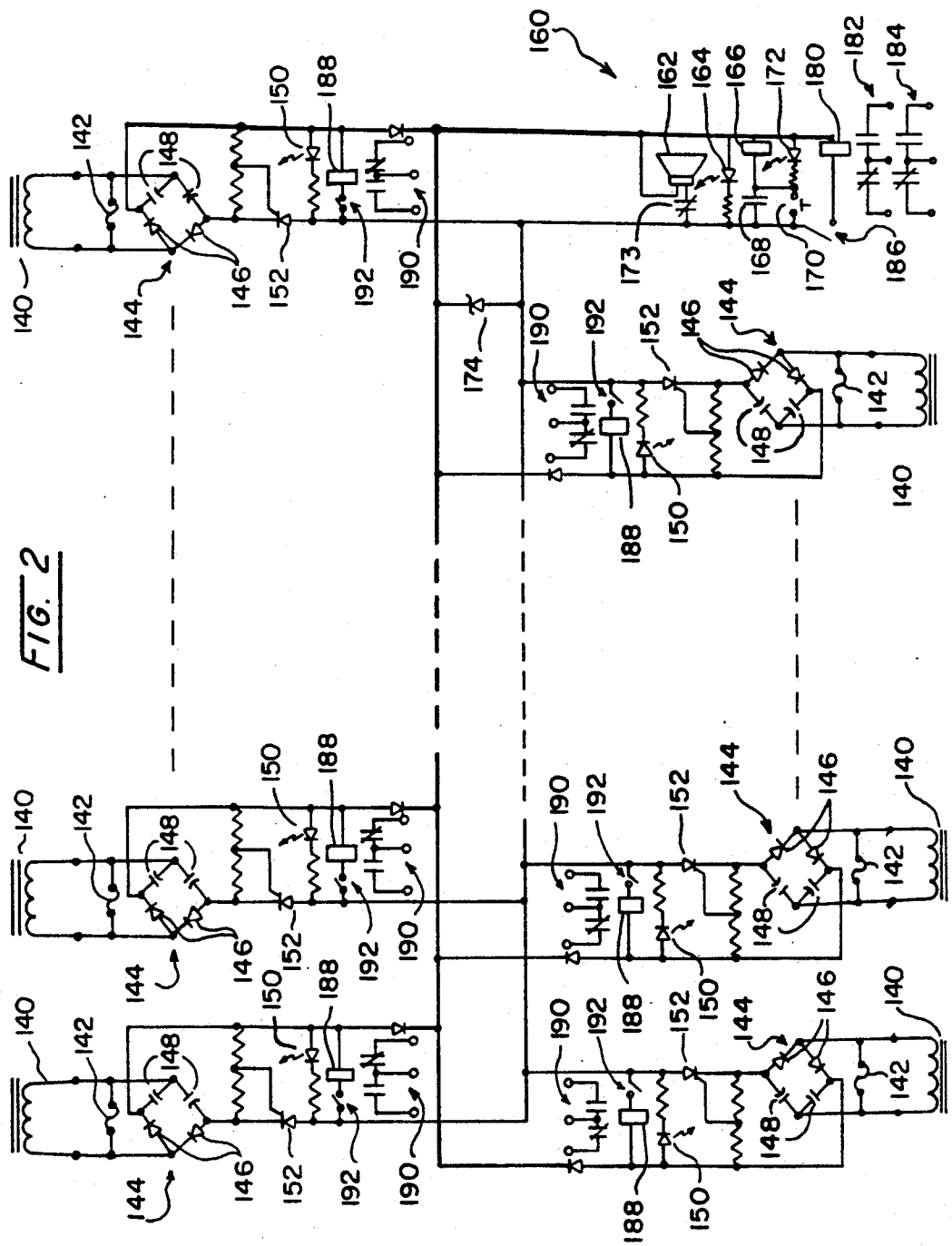

Reference will now be made to FIG. 2 which illustrates an alternate embodiment of neutral monitoring apparatus in accordance with the present invention capable of monitoring a plurality of neutral wires. As shown in FIG. 2, neutral wire coupling transformers 140 can be coupled individually to neutral wires of a power distribution system. Any reasonable number of transformers 140 can be provided with one working embodiment of the present invention comprising fifteen

(15) transformers 140 one of which is sufficiently large to monitor the main neutral bus of a power distribution system. Each of the individual transformers 140 is associated with a fuse element 142, preferably two fuse elements as illustrated and described with reference to FIG. 1 for detecting a first low level of current in its associated neutral and a second high level of current. Of course, additional fuses could be used if more than two current levels were of interest. The fuse elements 142 are as before connected in shunt across the transformers 140; however, in the embodiment of FIG. 2, a voltage doubler circuit 144 comprising a pair of diodes 146 and a pair of capacitors 148 is connected between each of the shunted transformers 140 and a visual identifying alarm comprising an LED 150.

Another difference in the embodiment of FIG. 2 is that an isolating silicon controlled rectifier (SCR) 152 has been inserted between the voltage doubler circuits 144 and the series combinations of resistors and the LED's 150. The SCR's 152 prevent the LED's 150 and circuitry connected thereto from shunting current away from the fuse elements 142 which could alter the operating characteristics of the fuse elements 142. The SCR's 152 also help to ensure that there are no false alarms generated prior to operation of one of the fuse elements 142 due to voltage drop across the fuse element. It should be apparent that the voltage doubler circuit 144 and/or the SCR 152 could be incorporated into a single neutral wire monitoring circuit as shown in FIG. 1 to perform similar operations therein. Such embodiments have not been explicitly illustrated herein for ease of illustration of the present invention.

Each of the individual transformers 140 and its associated circuitry is connected to a common bus for operation of a common alerting circuit 160. The alerting circuit 160 comprises a sounder device 162 which is the same as or comparable to the sounder device 124 of FIG. 1 and a LED 164 which is also the same as or comparable to the LED of FIG. 1. In addition, a relay coil 166 is connected through its own normally open contact 168 across the LED 164. The relay coil 166 is also connected to a momentary make switch 170 which is also connected to another LED 172. The sounder device 162 is connected across the LED 164 by a normally closed contact 173 of the relay 166 such that the sounder device 162 can be silenced. A zener diode 174 is also connected across the alerting circuit 160 to protect the alerting circuit 160 from excessive voltage which can be delivered by the transformers 140. Finally, second relay coil 180 having two sets of associated normally closed/normally open contacts 182, 184 is connected via a toggle switch 186 across the LED 164.

In operation, if one of the fuse elements 142 is operated by excessive current flowing in its associated neutral wire, the associated one of the LED's 150 is lighted, the sounder device 162 is activated and the LED 164 is lighted. If it is desired to quiet the sounder device 162, the momentary make switch 170 is activated to provide power to the relay coil 166 which in turn opens the normally closed contact 173 to silence the sounder deice 162 and closes the normally open contact 168 to lock up the connection of the relay coil 166 and maintain it in its operated state until power is removed from the alerting circuit 160. Closure of the contact 168 also lights the LED 172 to indicate that the sounder device 162 has been silenced.

If the switch 186 is closed, the relay coil 180 would also be energized to provide auxiliary control or remote alarm via the contacts 182, 184. The contacts 182, 184 could be used, for example, to trip a circuit breaker associated with the entire power distribution system being monitored. Relay coils 188 which control contacts 190 can be individually connected by selection switches 192 across their corresponding LED's 150 as shown in FIG. 2 such that circuit breakers for the individual circuits being monitored could be tripped by the contacts 190 in the event a second current level fuse element is operated.

It is apparent that features of the alerting circuit 160 can be incorporated into the single monitoring circuit of FIG. 1 if desired. Applicant has determined that dual element fuses rated at 0.25 amps and larger which are commercially available from Bussman under a designation MDQ are preferred for use in the present invention due to their low and stable resistance values over the range of currents from zero (0) to rated current and for their time delay features.

In certain applications the fuse means may preferably comprise a positive temperature coefficient (PTC) resistor rather than a conventional fuse element. PTC resistors for use in the present invention display an abrupt change their electrical resistance from low values to high values upon conduction of current equal to operating or trip points for the resistors. Such PTC resistors have lower resistance values than an equivalently current rated fuse. Reduced resistance values correspondingly reduce the potential of false triggering of the alarm due to voltage drop across the fuse means when momentary current surges occur on the connected load circuit, for example due to motor start up or the like. PTC resistors also can be reset such that they do not need to be replaced once operated as do conventional fuses. PTC resistors can be packaged to resemble barrel fuses or for connection to a barrel fuse holder to be interchangeable with conventional fuse elements for use in the present invention. PTC resistors are commercially available from Raychem Corporation of Menlo Park, Calif.

Having thus described the neutral wire current monitoring method and apparatus of the present invention in detail and by reference to preferred embodiments thereof, it will be apparent that modifications and variations are possible without departing from the scope of the invention defined in the appended claims.

What is claimed is:

1. Current monitoring apparatus for detecting at least one defined current level in a neutral circuit of a three-phase four-wire electric power distribution system, said current monitoring apparatus comprising:
   current transformer means coupled to said neutral circuit for generating a current signal representative of current flowing through said neutral circuit;
   fuse means connected in shunt across said current transformer means for conducting current signals up to a current rating of said fuse means; and
   alarm means connected in shunt across said fuse means for alerting personnel operating said power distribution system upon operation of said fuse means in response to current signals exceeding the current rating of said fuse means.

2. Current monitoring apparatus for detecting at least one defined current level in a neutral circuit of a three-phase four-wire electric power distribution system as claimed in claim 1 wherein said current transformer means is coupled to said neutral circuit by two or more loops of a wire within the neutral circuit to make the apparatus less sensitive to in-rush currents.

3. Current monitoring apparatus for detecting at least one defined current level in a neutral circuit of a three-phase four-wire electric power distribution system as claimed in claim 1 further comprising dc conversion means connected between said fuse means and said alarm means for converting said current signal received from said current transformer means to a dc signal for driving said alarm means if said fuse means is operated.

4. Current monitoring apparatus for detecting at least one defined current level in a neutral circuit of a three-phase four-wire electric power distribution system as claimed in claim 3 wherein said dc conversion means comprises a diode bridge circuit.

5. Current monitoring apparatus for detecting at least one defined current level in a neutral circuit of a three-phase four-wire electric power distribution system as claimed in claim 3 wherein said dc conversion means comprises a voltage doubler circuit.

6. Current monitoring apparatus for detecting at least one defined current level in a neutral circuit of a three-phase four-wire electric power distribution system as claimed in claim 3 further comprising electronic isolation means for isolating said alarm means from said dc conversion means to ensure that there are no false alarms and to prevent alteration of operating characteristics of said fuse means.

7. Current monitoring apparatus for detecting at least one defined current level in a neutral circuit of a three-phase four-wire electric power distribution system as claimed in claim 6 wherein said electronic isolation means comprises an SCR connected to conduct current through said alarm means and to be triggered by a defined voltage level across said dc conversion means, said defined voltage level only being reached upon operation of said fuse means.

8. Current monitoring apparatus for detecting at least one defined current level in a neutral circuit of a three-phase four-wire electric power distribution system as claimed in claim 6 wherein said current transformer means comprises a split transformer whereby said current monitoring apparatus can be coupled to said neutral circuit without disturbing said neutral circuit.

9. Current monitoring apparatus for detecting at least one defined current level in a neutral circuit of a three-phase four-wire electric power distribution system as claimed in claim 6 wherein said alarm means comprises an audible alarm.

10. Current monitoring apparatus for detecting at least one defined current level in a neutral circuit of a three-phase four-wire electric power distribution system as claimed in claim 9 wherein said alarm means further comprises a visual alarm.

11. Current monitoring apparatus for detecting at least one defined current level in a neutral circuit of a three-phase four-wire electric power distribution system as claimed in claim 1 wherein said fuse means comprises one of at lest two fuses each having different current ratings whereby the level of the current signal which activates said alarm means can be determined by selection of said one of said at least two fuses.

12. Current monitoring apparatus for detecting at least one defined current level in a neutral circuit of a three-phase four-wire electric power distribution system as claimed in claim 1 wherein said fuse means comprises a positive temperature coefficient resistance device.

13. A method of monitoring current in a neutral circuit of a three-phase four-wire electric power distribution system for detecting at least one defined current level therein comprising the steps of:
coupling a current transformer to said neutral circuit;
connecting first fuse means across said current transformer to shunt current signals generated by said transformer up to a first current rating of said first fuse means; and
connecting alarm means across said first fuse means, said alarm means being activated to generate an alarm signal upon operation of said first fuse means by current signals exceeding the rating of said first fuse means.

14. A method of monitoring current in a neutral circuit of a three-phase four-wire electric power distribution system as claimed in claim 13 wherein the step of coupling a current transformer to said neutral circuit comprises looping a wire of the neutral circuit two or more times through the current transformer to reduce sensitivity of in-rush current.

15. A method of monitoring current in a neutral circuit of a three-phase four-wire electric power distribution system as claimed in claim 13 further comprising the step of connecting second fuse means across said current transformer to shunt current signals generated up to a second current rating greater than said first current rating if said first fuse means is operated to present a high resistance value.

16. A method of monitoring current in a neutral circuit of a three-phase four-wire electric power distribution system as claimed in claim 15 wherein said first and second fuse means comprise positive temperature coefficient resistance devices.

17. A method of monitoring current in a neutral circuit of a three-phase four-wire electric power distribution system as claimed in claim 15 wherein said alarm means comprises an audible alarm.

18. A method of monitoring current in a neutral circuit of a three-phase four-wire electric power distribution system as claimed in claim 17 wherein said alarm means further comprises a visible alarm.

19. A method of monitoring current in a neutral circuit of a three-phase four-wire electric power distribution system as claimed in claim 13 further comprising the step of converting said current signals received from said current transformer to a dc signal for driving said alarm means if said first fuse is operated.

20. A method of monitoring current in a neutral circuit of a three-phase four-wire electric power distribution system as claimed in claim 19 further comprising the step of electronically isolating said alarm means from said dc signal to ensure that there are no false alarms and to prevent alteration of operating characteristics of said fuse means.

* * * * *